United States Patent [19]
Bae

[11] Patent Number: 5,920,083
[45] Date of Patent: Jul. 6, 1999

[54] THIN-FILM TRANSISTOR DISPLAY DEVICES HAVING COPLANAR GATE AND DRAIN LINES

[75] Inventor: Byung-Seong Bae, Kyungki-do, Rep. of Korea

[73] Assignee: Samsung Electronics Co., Ltd., Rep. of Korea

[21] Appl. No.: 08/846,019

[22] Filed: Apr. 25, 1997

[30] Foreign Application Priority Data

May 21, 1996 [KR] Rep. of Korea ....................... 96-17223

[51] Int. Cl.⁶ ...................................................... H01L 29/04
[52] U.S. Cl. ................................. 257/59; 257/72; 349/139
[58] Field of Search ......................... 257/59, 72; 349/139

[56] References Cited

U.S. PATENT DOCUMENTS

| 5,604,358 | 2/1997 | Kim | 257/59 |
| 5,790,222 | 8/1998 | Kim | 349/139 |

*Primary Examiner*—Mark V. Prenty
*Attorney, Agent, or Firm*—Myers Bigel Sibley & Sajovec

[57] ABSTRACT

Methods of forming thin-film transistor display devices having coplanar gate and drain lines include the steps of forming gate and data lines using the same level of metallization and also using an etch stop layer to protect the active regions of the TFTs in each of the display cells. A preferred method includes the steps of forming a first conductive layer on a substrate and then patterning the first conductive layer to define a plurality of parallel gate lines and a plurality of parallel data lines which each comprise a plurality of data line segments. A first electrically insulating layer is then formed on the data and gate lines. A first undoped amorphous silicon (a-Si) layer is then formed on the first electrically insulating layer and patterned to define an amorphous silicon active region for each cell. A second electrically insulating layer is then formed on the amorphous silicon active region. The first and second electrically insulating layers are then patterned to expose source and drain portions of the amorphous silicon active region and define at least one data line contact hole which exposes a portion of a data line segment for each cell. A second amorphous silicon layer of first conductivity type (e.g., N-type) is then formed on the exposed source and drain portions of the amorphous silicon active region and in the data line contact holes. An optically transparent conductive layer (e.g., indium-tin-oxide (ITO)) is then formed on the second amorphous silicon layer. Then, the optically transparent conductive layer and the doped second amorphous silicon layer are etched to define a source electrode (which electrically connects the data line to the source portion of the amorphous silicon active region) and define a pixel electrode (which is electrically connected to the drain portion of the amorphous silicon active region).

3 Claims, 14 Drawing Sheets

THIN-FILM TRANSISTOR DISPLAY DEVICES HAVING COPLANAR GATE AND DRAIN LINES

FIELD OF THE INVENTION

The present invention relates to display devices and methods of fabrication, and more particularly to liquid crystal display devices and methods of fabricating liquid crystal display devices.

BACKGROUND OF THE INVENTION

In order to minimize the space required by display devices, research into the development of various flat panel display devices such as LCD display devices, plasma display panels (PDP) and electro-luminescence displays (EL), has been undertaken to displace larger cathode-ray tube displays (CRT) as the most commonly used display devices. Particularly, in the case of LCD display devices, liquid crystal technology has been explored because the optical characteristics of liquid crystal material can be controlled in response to changes in electric fields applied thereto.

At present, the dominant methods for fabricating liquid crystal display devices (LCD) and panels are methods based on amorphous silicon (a-Si) thin film transistor (TFT) technologies. Using these technologies, high quality image displays of substantial size can be fabricated using low temperature processes. As will be understood by those skilled in the art, conventional LCD devices typically include a transparent (e.g., glass) substrate with an array of thin film transistors thereon, pixel electrodes, orthogonal gate and data lines, a color filter substrate and liquid crystal material between the transparent substrate and color filter substrate. The use of a-Si TFT technology typically also requires the use of separate peripheral integrated circuitry to drive the gates and sources (i.e., data inputs) of the TFTs in the array. Therefore, there is typically provided a large number of pads for connecting the gate lines (which are coupled to the gates of the TFTs) and data lines (which are coupled to the sources of the TFTs) to the peripheral drive circuitry.

Unfortunately, a-Si TFT devices may be prone to relatively large off-state leakage currents in part because amorphous silicon typically has a relatively high photoconductivity. One attempt to reduce leakage currents included the use of thinner amorphous silicon active regions having higher net source-to-drain resistance. However, these thinner active regions are typically susceptible to deterioration when these regions are exposed to back-end processing steps which include chemical etchants, for example. To address this problem, methods have been proposed to reduce the likelihood that thinner active regions will be adversely affected by back-end processing steps.

For example, FIG. 1 illustrates a prior art TFT display device which includes a protective etch-stop region and FIGS. 2A–2D illustrate a method of fabricating the device of FIG. 1. In particular, FIG. 1 illustrates a TFT display device comprising a gate electrode 2 on a substrate 1, a gate insulating region 3 on the gate electrode and a patterned amorphous silicon region 4 on the gate insulating region 3, opposite the gate electrode 2. A relatively highly doped amorphous silicon contact region 4 is also provided to facilitate the formation of low resistance contacts between source and drain electrodes 7 and 8 and the patterned amorphous silicon region 4. An etch stop 5 is also provided so that during a step of patterning the amorphous silicon contact region 4 into separate regions, the channel portion of the patterned amorphous silicon region 4 is not exposed to a chemical etchant. The TFT display device is also protected by a passivation layer 9. A conventional method of forming the TFT display device of FIG. 1 will now be described. As illustrated best by FIG. 2A, a gate electrode 2 is initially patterned on a face of a transparent substrate 1 and then a blanket electrically insulating layer 3 is deposited on the gate electrode 2. Then, a blanket amorphous silicon layer 40 and nitride layer 50 are formed in sequence on the electrically insulating layer 3 using such conventional techniques as plasma enhanced chemical vapor deposition (PECVD).

Referring now to FIG. 2B, a layer of photoresist (not shown) is then deposited on the nitride layer 50 and exposed by a light source which penetrates the substrate 1, but is selectively blocked by the patterned gate electrode 2. An etch stopper 5 is then formed by wet etching the nitride layer 50 using the layer of photoresist as a mask. As illustrated best by FIG. 2C, a doped layer of amorphous silicon (e.g. N-type) is deposited on the etch stopper 5 and on the blanket amorphous silicon layer 40. The doped layer of amorphous silicon and blanket amorphous silicon layer 40 are then patterned using conventional techniques to define an amorphous silicon active region 4 having a doped amorphous silicon contact region 6 thereon. Referring now to FIG. 2D, a blanket metal layer is then deposited and patterned using an etching technique to define source and drain electrodes 7 and 8. Here, during the step of patterning the blanket metal layer, the doped amorphous silicon contact region 6 is also etched to form separate source and drain amorphous silicon contact regions. During this patterning step, the etch stopper 5 is used as a mask to protect the amorphous silicon active region 4 from etching damage. Thereafter, a blanket passivation layer is formed on an upper surface of the TFT device.

Notwithstanding the above described method of forming TFT display devices, there continues to be a need for improved methods of forming TFT display devices.

SUMMARY OF THE INVENTION

It is therefore an object of the present invention to provide improved methods of forming thin-film transistor display devices and devices formed thereby.

It is another object of the present invention to provide methods of forming thin-film transistor display devices which require a limited number of photolithographic alignment steps, and devices formed thereby.

It is still another object of the present invention to provide methods of forming thin-film transistor display devices having reduced susceptibility to parasitic leakage currents, and devices formed thereby.

It is yet another object of the present invention to provide methods of forming thin-film transistor display devices having highly integrated layers of metallization, and devices formed thereby.

These and other objects, features and advantages of the present invention are provided by methods of forming thin-film transistor (TFT) display devices which comprise the steps of forming gate and data lines using the same level of metallization and also using an etch stop layer to protect the active regions of the TFTs in each of the display cells of the display devices, and devices formed thereby. In particular, according to one embodiment of the present invention, a method of forming a TFT display device containing liquid crystal display (LCD) cells therein includes the steps of forming a first conductive layer on a face of a substrate and then patterning the first conductive layer to define a plurality of parallel gate lines (with gate electrodes extending therefrom) and a plurality of parallel data lines which each comprise a plurality of data line segments. A first electrically insulating layer (e.g., $SiO_2$, $Si_3N_4$) is then formed on the data lines, the gate lines and the face of the substrate. A first undoped amorphous silicon (a-Si) layer is then formed on the first electrically insulating layer and patterned to define an amorphous silicon active region (for each cell) which extends opposite a respective gate electrode. A second electrically insulating layer is then formed as a passivation layer on the amorphous silicon active region and on the first electrically insulating layer. The first and second electrically insulating layers are then patterned to expose source and drain portions of the amorphous silicon active region and define at least one data line contact hole which exposes a portion of a data line segment for each cell.

A second amorphous silicon layer of first conductivity type (e.g., N-type) is then formed on the exposed source and drain portions of the amorphous silicon active region and in the data line contact hole for each display cell. An optically transparent conductive layer (e.g., indium-tin-oxide (ITO)) is then formed on the second amorphous silicon layer. Then, using the patterned second electrically insulating layer as an etch stop to protect the amorphous silicon active region of each cell, the optically transparent conductive layer and the doped second amorphous silicon layer are etched to define a source electrode (which electrically connects the data line to the source portion of the amorphous silicon active region) and define a pixel electrode (which is electrically connected to the drain portion of the amorphous silicon active region).

According to another embodiment of the present invention, a thin-film transistor (TFT) liquid crystal display (LCD) device is provided which comprises a transparent substrate and a plurality of TFT-LCD cells having respective pixel electrodes. A gate line is also provided to interconnect the gate electrodes of a row of thin-film transistor display cells and a data line is provided to interconnect a column of thin-film transistor display cells. Each data line is comprised of a plurality of data line segments which are preferably spaced end-to-end as a string of data line segments. According to a preferred aspect of the present invention, the data line(s) and gate line(s) are formed as coplanar lines by patterning the data line(s) and gate line(s) from the same conductive layer. This improves the degree of integration of the patterned conductive layers at an early stage during fabrication and allows for greater flexibility in the design and layout of subsequently formed regions and devices. A plurality of data line jumpers are also provided to electrically connect the data line segments in each data line together. These data line jumpers may be comprised of an optically transparent conductive material (e.g., ITO) and more preferably are comprised of a composite of an optically transparent conductive material and doped (e.g., N-type) amorphous silicon.

DESCRIPTION OF PREFERRED EMBODIMENTS

Figure 1:
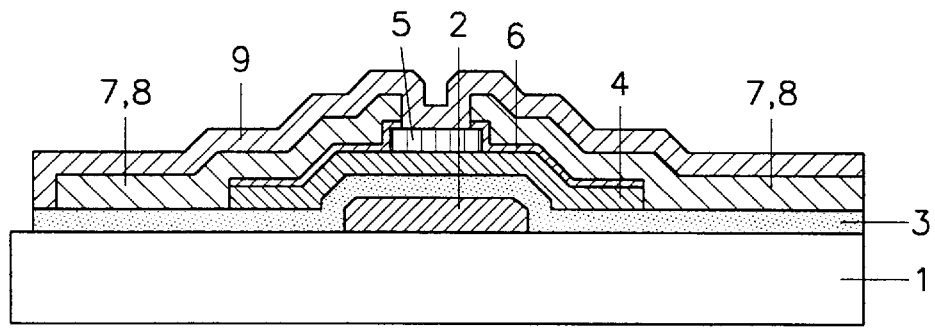
FIG. 1 illustrates a schematic cross-sectional view of a conventional thin-film transistor (TFT) display device.
Figure 2A:
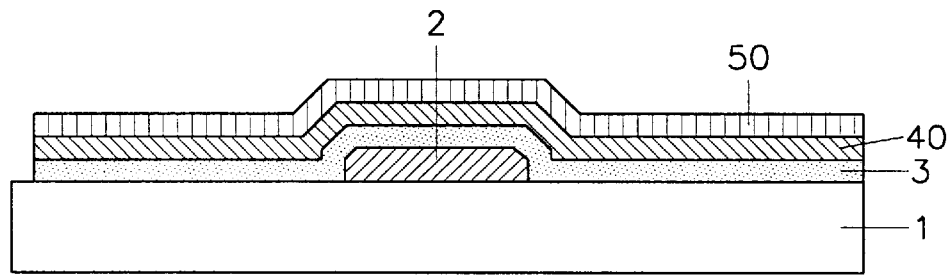
FIGS. 2A–2D illustrate schematic cross-sectional views of intermediate structures illustrating a method of forming the thin-film transistor (TFT) display device of FIG. 1.
Figure 2B:
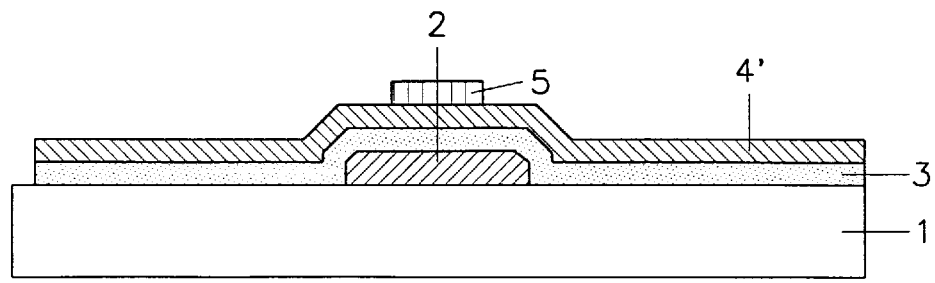
Figure 2C:
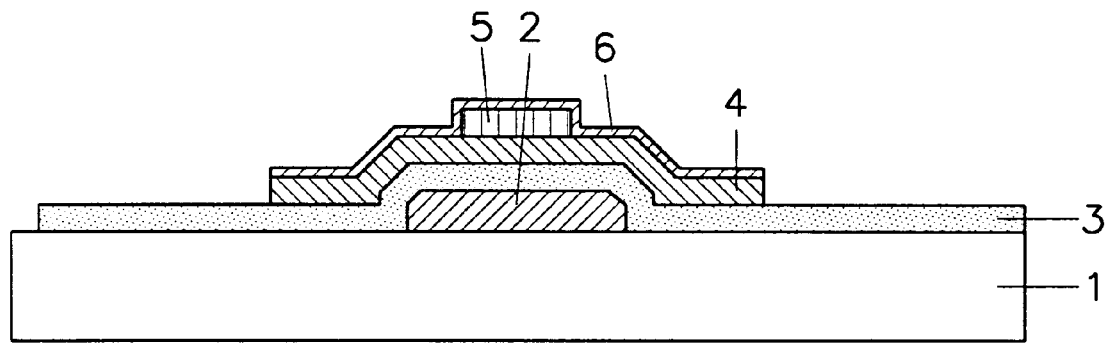
Figure 2D:
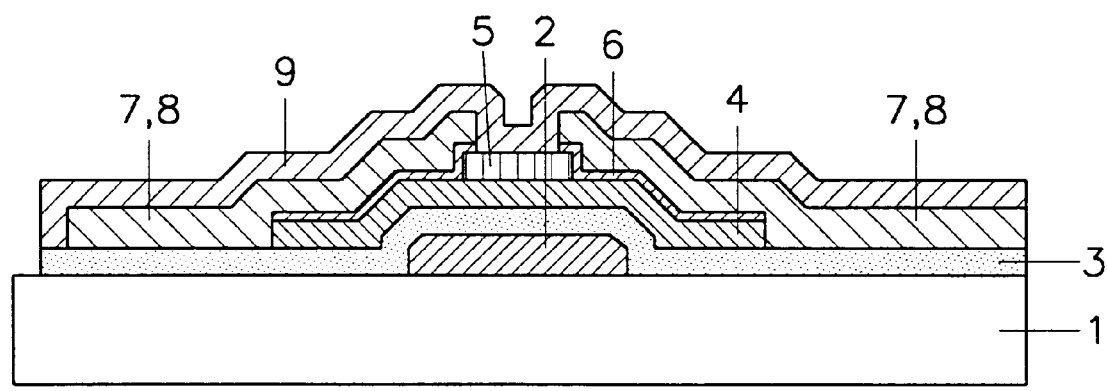

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
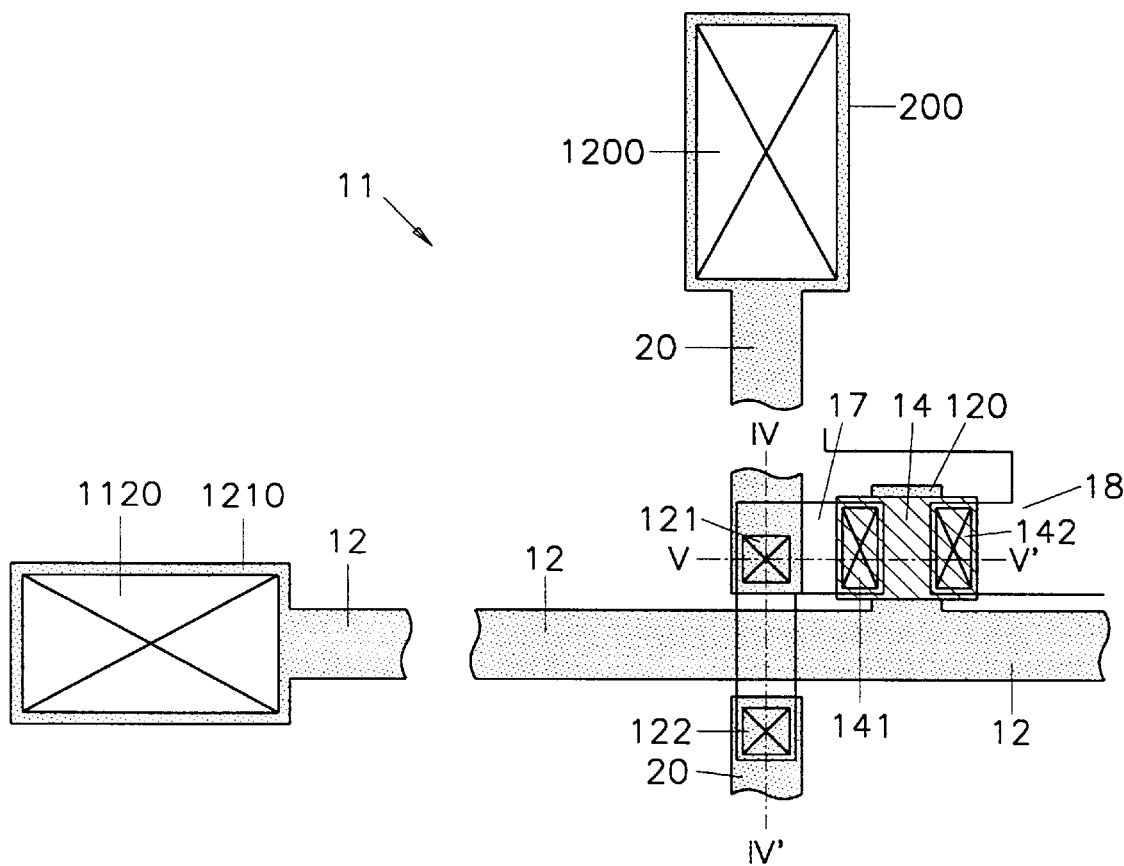
FIG. 3 is a layout schematic of a thin-film transistor (TFT) display device according to a first embodiment of the present invention.
Figure 4:
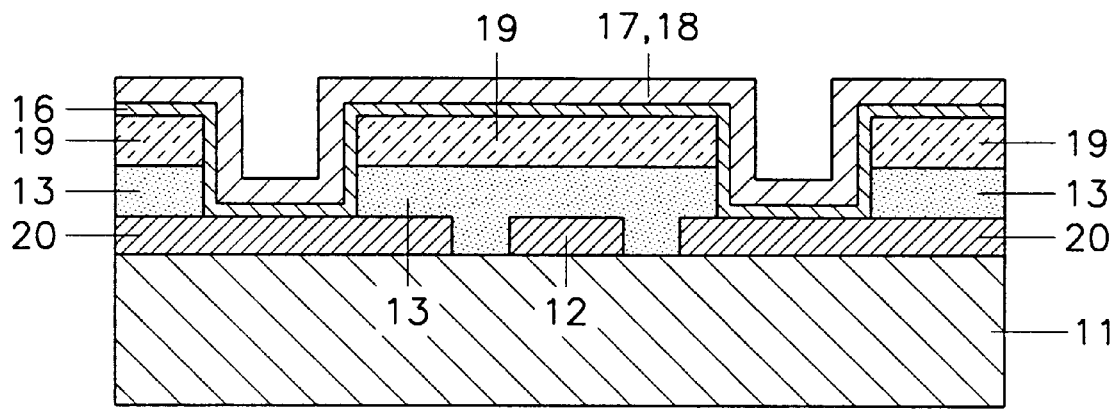
FIG. 4 is a cross-sectional view of the display device of FIG. 3, taken along line IV–IV'.
Figure 5:
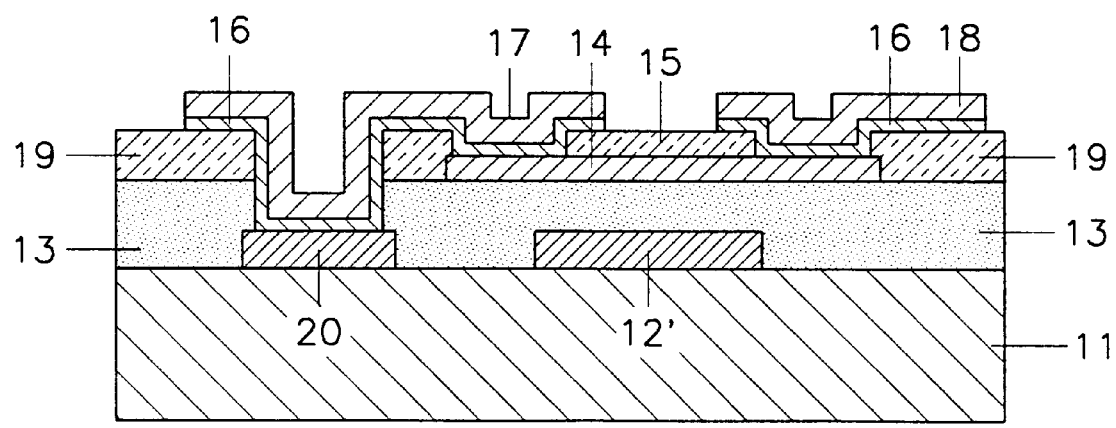
FIG. 5 is a cross-sectional view of the display device of FIG. 3, taken along line V–V'.

Referring now to FIGS. 3–5, a thin-film transistor display device according to a first embodiment of the present invention will be described. In particular, a preferred display device comprises a two-dimensional array of TFT-LCD display cells. Each display cell is electrically coupled to a respective gate line 12 and a respective data line 20 which is comprised of a plurality of data line segments. These data line segments are coplanar with the gate lines 12 in the array, but are patterned to extend in orthogonal directions relative to the gate lines 12 so that an N×N matrix or grid of gate and data lines can be formed using the same level of metallization. As illustrated best by FIG. 3, each gate line 12 has a plurality of gate electrodes 120 extending from one side thereof in a direction parallel to the data lines 20. Electrical contact to each gate line 12 is also made through a contact hole 1120 to a gate pad 1210. Each data line segment in a respective data line 20 is also electrically joined by a respective data line jumper. Preferably, each data line jumper is contiguous with a respective source electrode 17. As illustrated, these data line jumpers are electrically connected through contact holes 121, 122 to respective data line segments. Electrical contact to each data line 20 is also made through a contact hole 1200 to a data pad 200. Referring still to FIG. 3, each display cell also comprises a patterned amorphous silicon active region 14 which extends opposite a respective gate electrode 120. Source and drain contact holes 141 and 142 are also formed in a passivation layer to expose source and drain portions of the amorphous silicon active region 14. A transparent conductive layer comprising indium-tin-oxide, for example, is also patterned to define a source electrode 17, which electrically connects the source portion of the amorphous silicon active region 14 to a data line segment (through a contact hole 121), and define a drain/pixel electrode 18 for each cell.

Referring now to FIGS. 4–5, cross-sectional views of the display device of FIG. 3, taken along lines IV–IV' and V–V', respectively, will be described. As illustrated by FIG. 4, a data line jumper electrically connects opposing ends of adjacent data line segments 20 so that display data can be provided to each display cell in each column of cells, even though the data line segments 20 are patterned at the same level and from the same conductive layer as the gate lines 12. As explained more fully hereinbelow, the data line jumpers preferably comprise a composite of an amorphous silicon layer 16 of first conductivity type (e.g., N-type) and a transparent conductive layer (e.g., indium-tin-oxide) which is patterned as a source electrode 17 and a pixel electrode 18. In addition, the gate line 12 and data line segments 20 are electrically insulated from each other on a substrate 11 (e.g., transparent substrate) by a first electrically insulating layer 13 (e.g., $SiO_2$, $Si_3N_4$). A second electrically insulating layer 19 (e.g., passivation layer) may also be provided as described more fully hereinbelow with respect to FIGS. 7A–7E and 8A–8E. As illustrated by FIG. 4, drain line contact holes are patterned in the first and second electrically insulating layers 13 and 19 to expose the ends of the data line segments 20, prior to formation of the data line jumpers.

Referring now to FIG. 5, a cross-sectional view of a preferred TFT display cell is illustrated. Here, an end view of a data line segment 20 and a cross-sectional view of a gate electrode 120 are illustrated on the face of the substrate 11. The active region of the TFT (i.e., source, channel and drain regions) includes an amorphous silicon active region 14 which is formed on the first electrically insulating layer 13 and extends opposite the active region 14. A second electrically insulating layer 19 is also provided on the first electrically insulating layer 13. The second electrically insulating layer 19 is patterned to define an etch stopper region 15 and expose source and drain portions of the active region 14. The first and second electrically insulating layers 13 and 19 are also patterned to define data line contact holes which expose upper surfaces of the data line segments. A combined data line jumper/source electrode 17 and pixel electrode 18 are also provided by forming a doped amorphous silicon layer 16 on the patterned second electrically insulating layer 19 and then forming a transparent conductive layer on the doped amorphous silicon layer 16. These layers are then patterned to define separate electrodes 17 and 18.

Figure 7A:
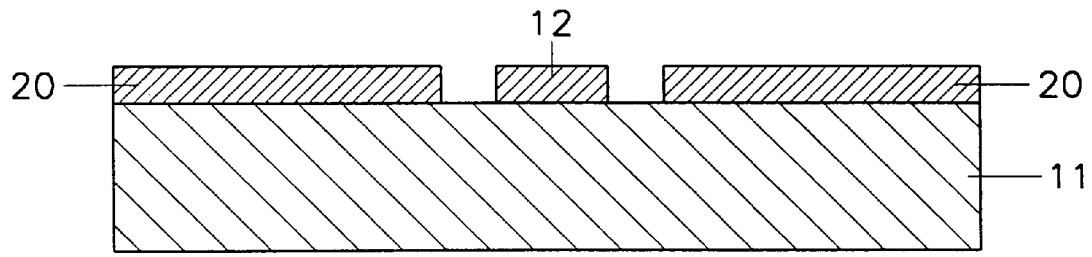
FIGS. 7A–7E illustrate schematic cross-sectional views of intermediate structures illustrating a method of forming the display device of FIG. 3, taken along line VII–VII' in FIGS. 6A–6C.
Figure 7B:
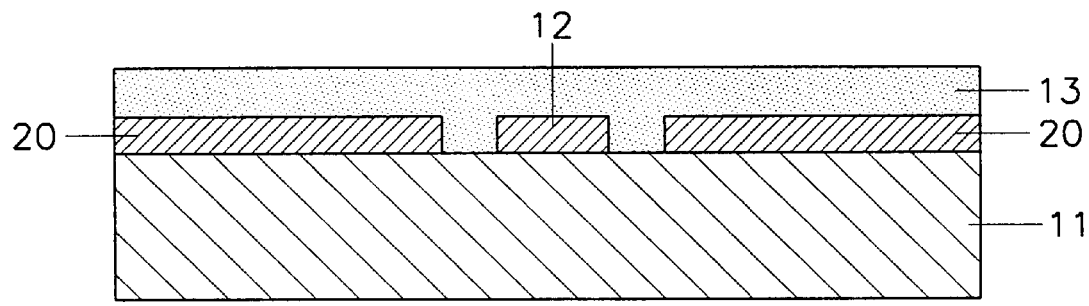
Figure 7C:
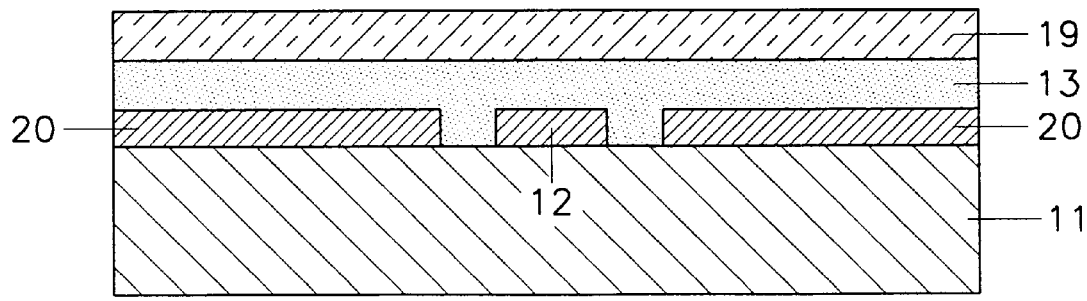
Figure 7D:
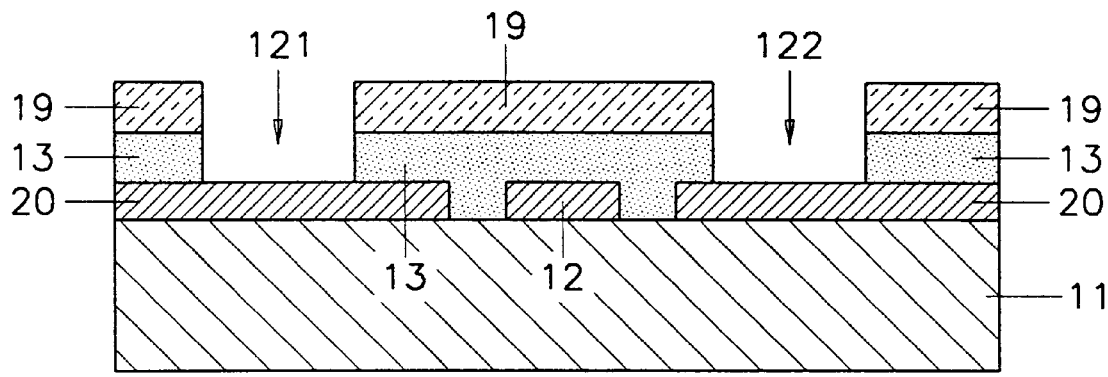
Figure 7E:
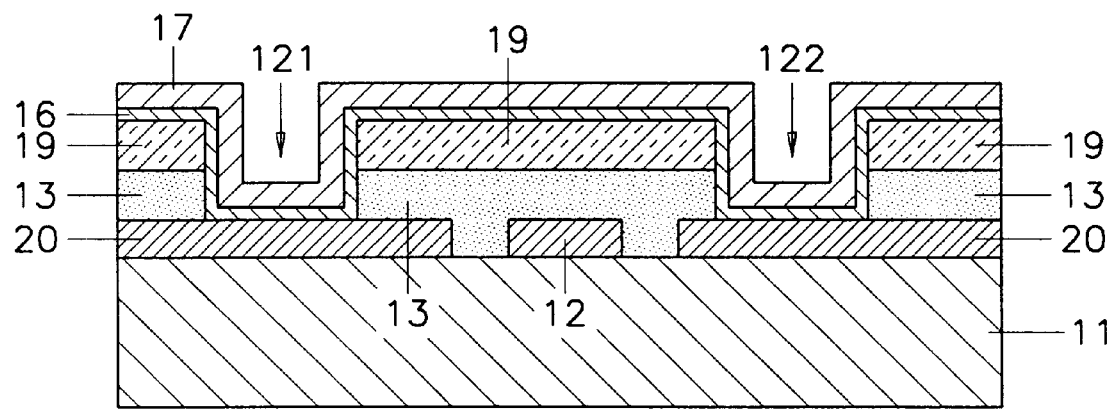
Figure 8A:
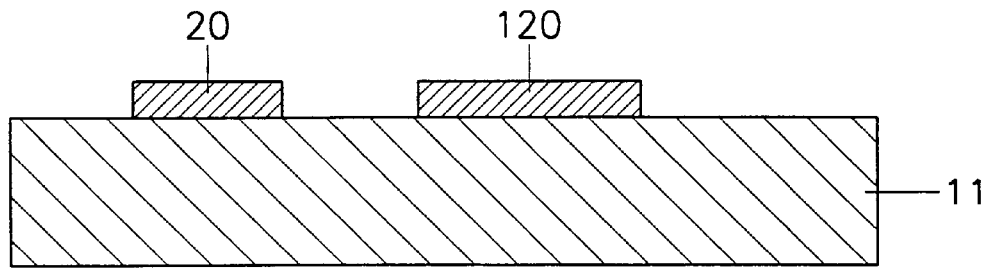
FIGS. 8A–8E illustrate schematic cross-sectional views of intermediate structures illustrating a method of forming the display device of FIG. 3, taken along line VIII–VIII' in FIGS. 6A–6C.
Figure 8B:
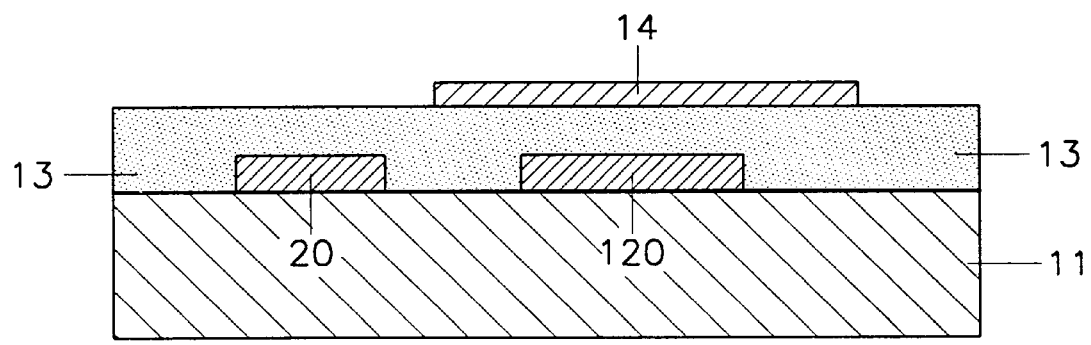
Figure 8C:
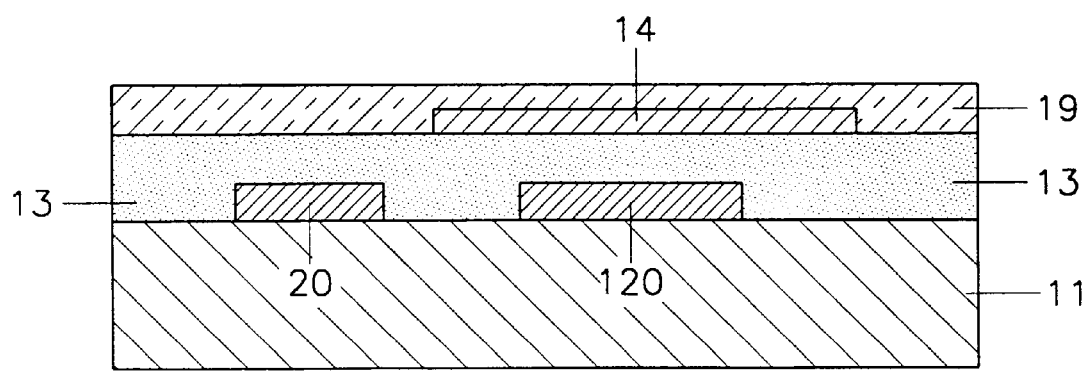

Referring now to FIGS. 7A–7E and 8A–8E, a preferred method of forming a display device according to a first embodiment of the present invention will be described. For sake of clarity, the cross-sectional views of FIGS. 7E and 8E correspond to the cross-sectional views of FIGS. 4 and 5, respectively. As illustrated best by FIGS. 7A and 8A, a first conductive layer (e.g., metal) is initially formed on a face of a transparent substrate 11 and then patterned to define data line segments 20 spaced end-to-end and a gate line 12 having a gate electrode 120 extending from a side thereof. As illustrated by FIGS. 7B and 8B, a first electrically insulating layer 13 is then formed on the patterned first conductive layer. This first electrically insulating layer 13 may comprise silicon dioxide or silicon nitride. As illustrated by FIGS. 7C and 8C, an undoped layer of amorphous silicon (a-Si) is then deposited and patterned to define an amorphous silicon active region 14 which extends opposite the gate electrode 120 of the TFT. A second electrically insulating layer 19 such as a passivation layer is then deposited on the first electrically insulating layer 13 and on an upper surface of the amorphous silicon active region 14.

Figure 6A:
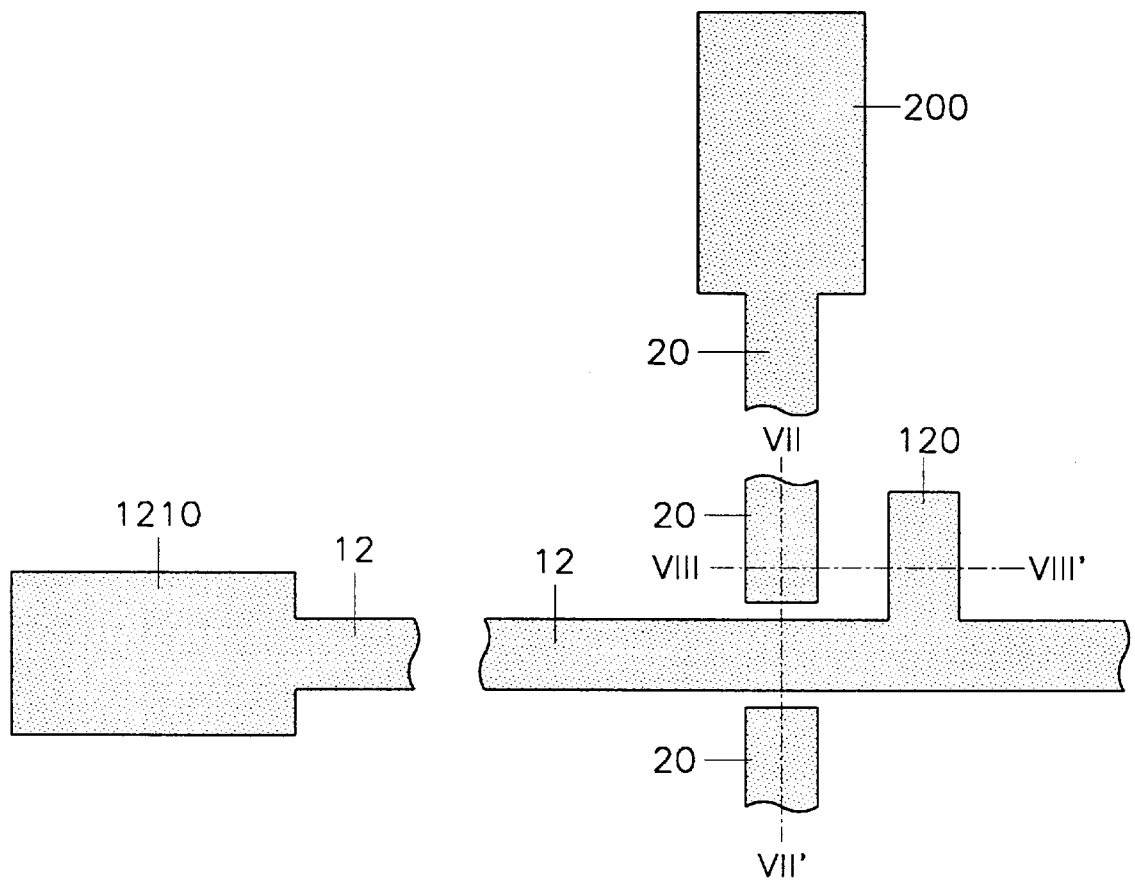
FIGS. 6A–6C are intermediate layout schematic views illustrating a method of forming the display device of FIG. 3.
Figure 6B:
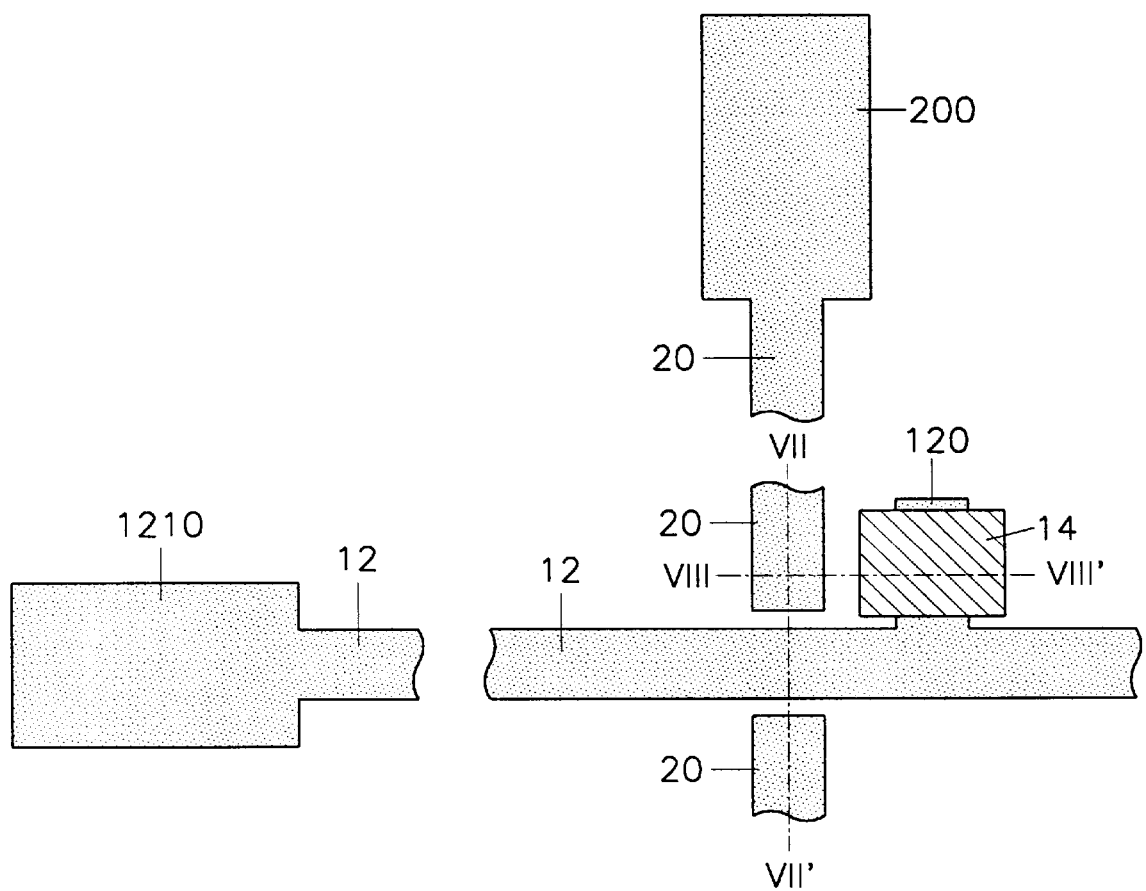
Figure 6C:
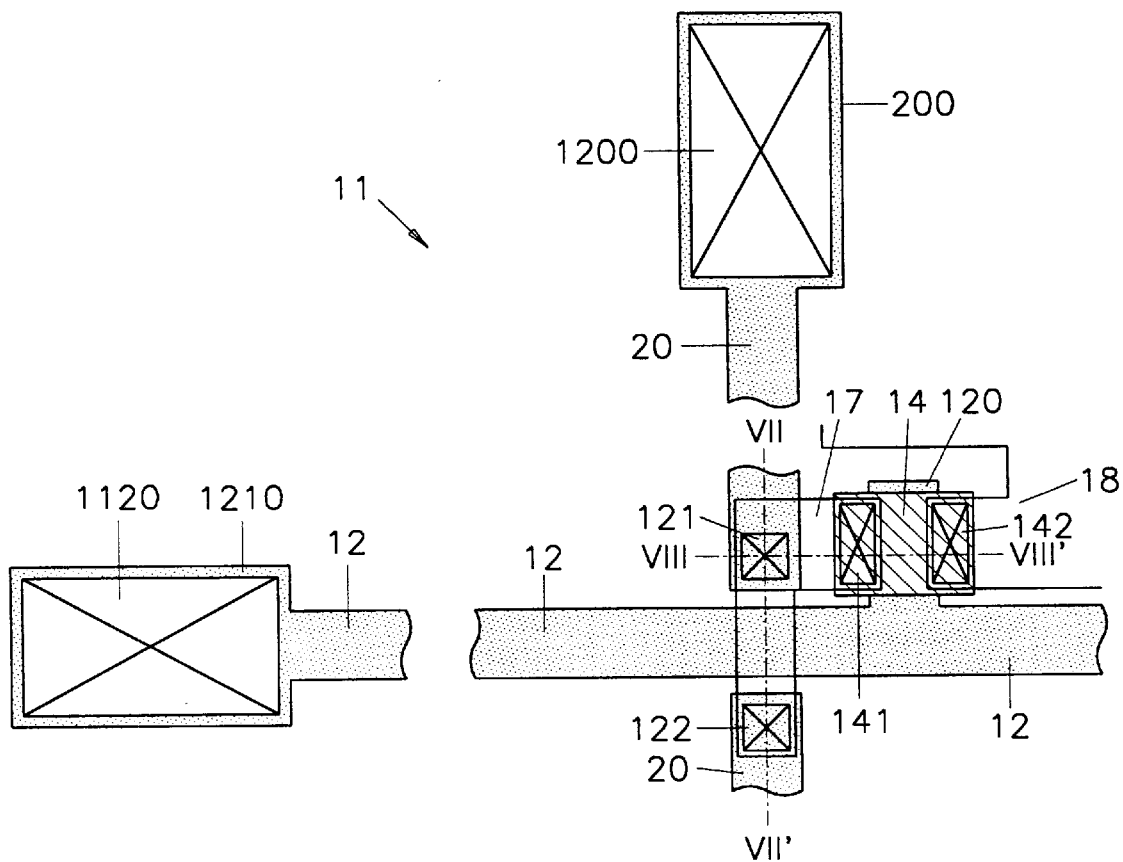
Figure 8D:
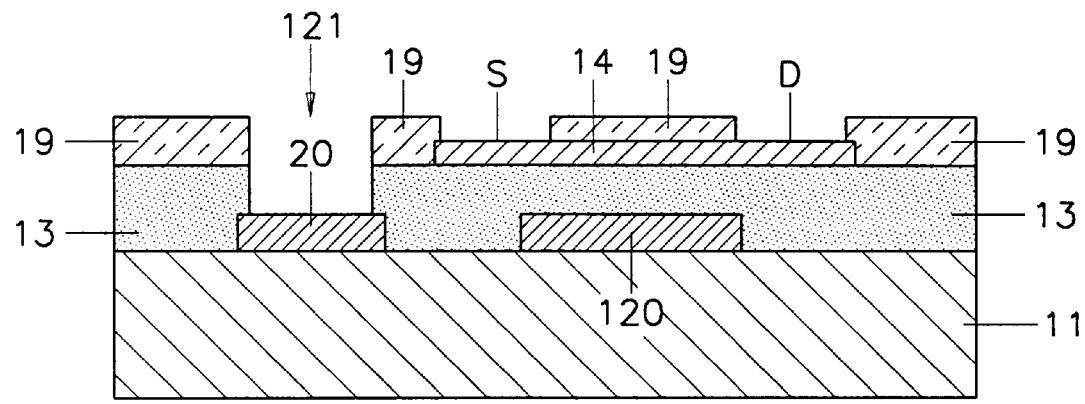
Figure 8E:
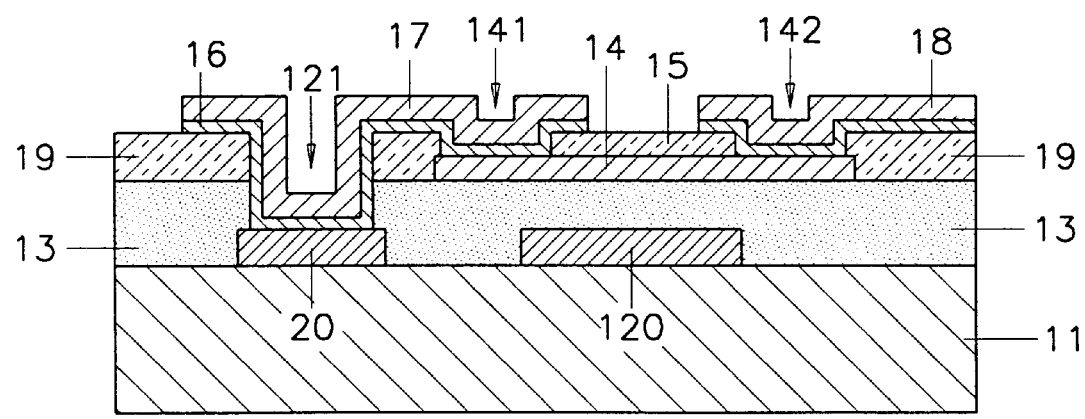

Referring now to FIGS. 7D and 8D, the first and second electrically insulating layers 13 and 19 are then patterned using conventional techniques to define data line contact holes 121 and 122 and expose spaced source (S) and drain (D) portions of the amorphous silicon active region 14 through contact holes 141 and 142. Finally, as illustrated best by FIGS. 7E and 8E, a doped layer (e.g., N-type) of amorphous silicon 16 and a transparent conductive layer (e.g., indium-tin-oxide (ITO)) are then formed in sequence on the structures of FIGS. 7D and 7E. These layers are then patterned by performing an etching step to define a source electrode/drain line jumper 17 and a pixel electrode 18. As will be understood by those skilled in the art, the channel portion (i.e., the TFT's channel region) of the amorphous silicon active region 14 is protected from this etching step by a central portion of the second electrically insulating layer 19 which acts as an etch stopper region 15. Thus, the amorphous silicon active region 14 can be made thin to reduce parasitic leakage current across the channel portion and the etch stopper region 15 can be provided so that the electrical characteristics of the TFT's channel region can be protected from the deterioration which might result if the TFT's channel region was exposed to an etchant. These above steps are also further illustrated by FIGS. 6A–6C. In particular, FIG. 6A illustrates a layout schematic view of the structure of FIGS. 7A and 8A; FIG. 6B illustrates a layout schematic view of the structure of FIGS. 7B and 8B; and FIG. 6C illustrates a layout schematic view of the structures of FIGS. 7E and 8E.

Figure 9:
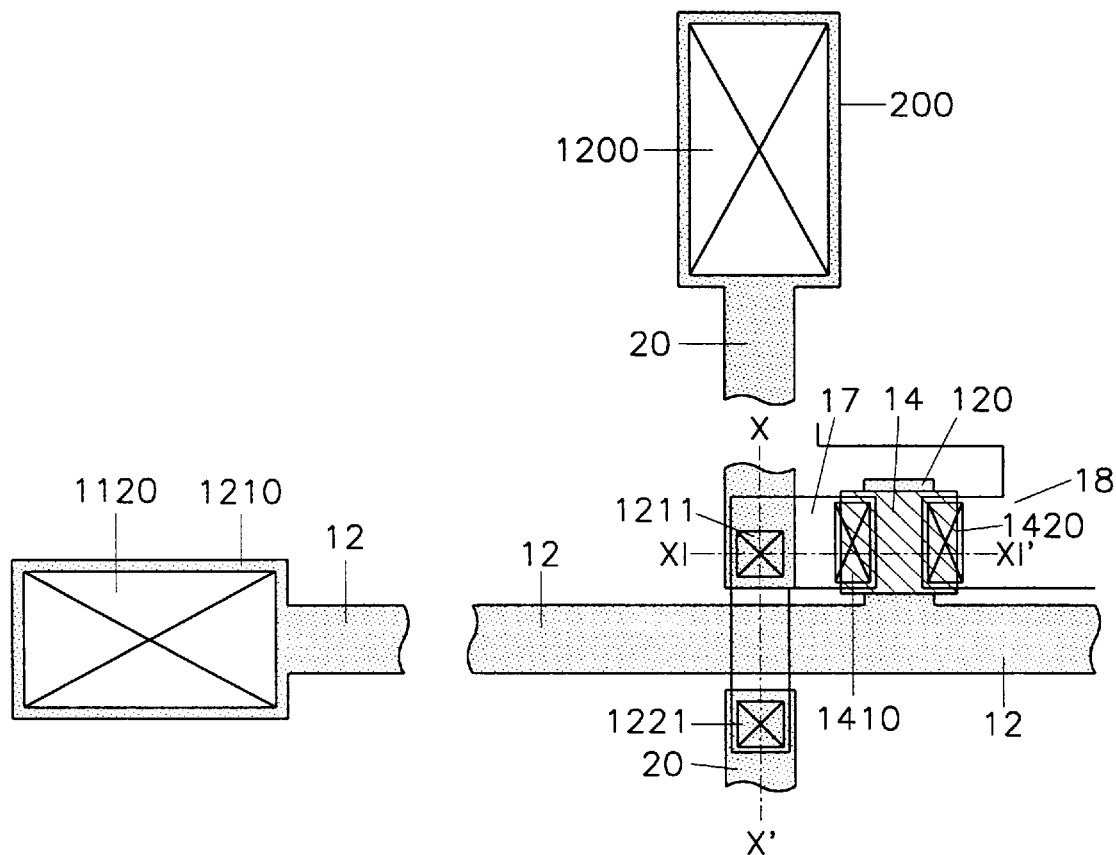
FIG. 9 is a layout schematic of a thin-film transistor (TFT) display device according to a second embodiment of the present invention.
Figure 10:
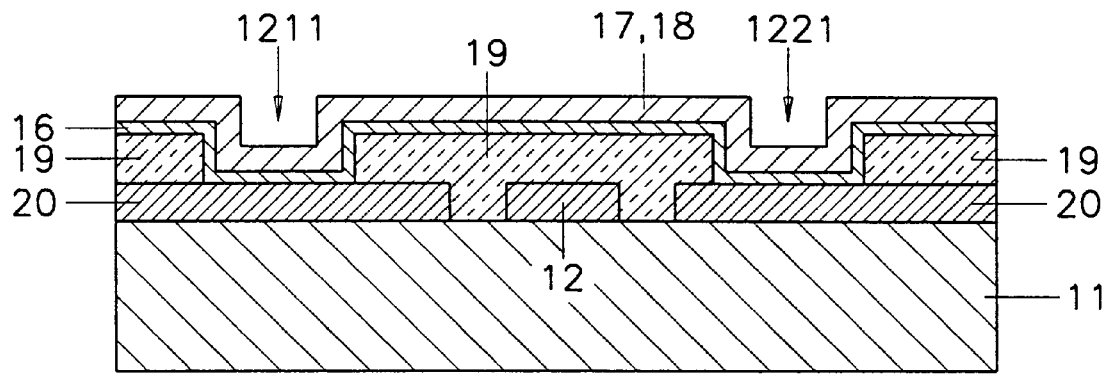
FIG. 10 is a cross-sectional view of the display device of FIG. 9, taken along line X–X' in FIG. 9.
Figure 11:
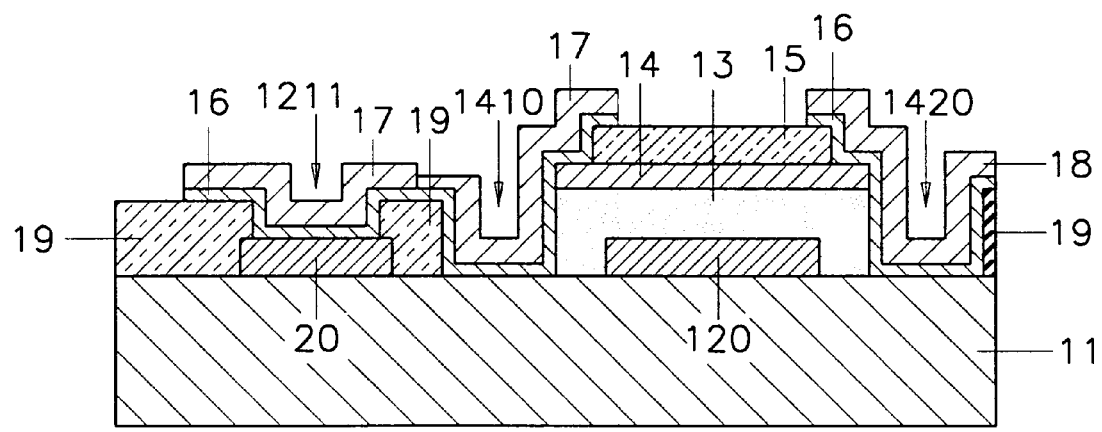
FIG. 11 is a cross-sectional view of the display device of FIG. 9, taken along line XI–XI' in FIG. 9.
Figure 12:
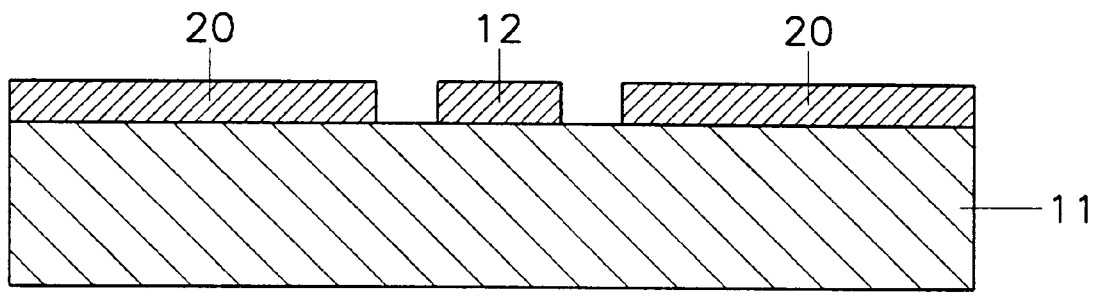
FIG. 12 illustrates a schematic cross-sectional view of an intermediate structure illustrating a method of forming the display device of FIG. 9, taken along line X–X' in FIG. 9.
Figure 13:
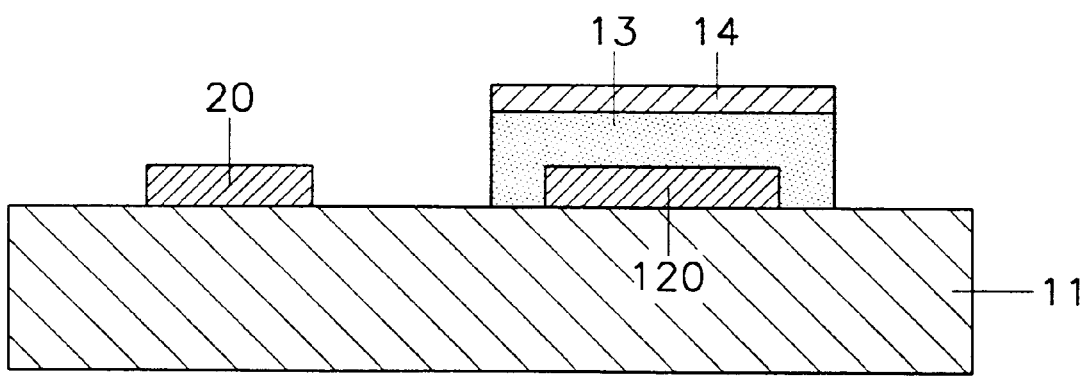
FIG. 13 illustrates a schematic cross-sectional view of an intermediate structure illustrating a method of forming the display device of FIG. 9, taken along line XI–XI' in FIG. 9.

Referring now to FIGS. 9–13, a second embodiment of the present will be described. In particular, FIG. 9 illustrates a layout schematic of a display device which is similar to the display device illustrated by FIG. 3, however, the drain line contact holes 1211 and 1221 and the source and drain contact holes 1410 and 1420 are formed in a different manner relative to the contact holes illustrated by FIG. 3. For example, as best illustrated by FIGS. 12 and 13, the drain line segments 20 and gate line 12 are patterned from a first conductive layer. Then, a first electrically insulating layer and amorphous silicon layer are deposited in sequence on the gate electrode 120 and then patterned to define a gate insulating layer 13 and an amorphous silicon active region 14 on the gate insulating layer 13. However, unlike the structures of FIGS. 7A–7E and 8A–8E, the first electrically insulating layer is preferably removed from the data line segments 20 and gate line 12.

Then, as illustrated best by FIGS. 10 and 11, a second electrically insulating layer 19 is deposited and patterned to expose the data line segments 20 through data line contact holes 1211 and 1221 and the face of the substrate 11 at source and drain contact holes 1410 and 1420. Then, a doped layer (e.g., N-type) of amorphous silicon 16 and a transparent conductive layer (e.g., indium-tin-oxide (ITO)) are formed in sequence. These layers are then patterned by performing an etching step to define a source electrode/drain line jumper 17 and a pixel electrode 18. As will be understood by those skilled in the art, the channel portion (i.e., the TFT's channel region) of the amorphous silicon active region 14 is protected from this etching step by a central portion of the second electrically insulating layer 19 which acts as an etch stopper region 15.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A thin-film transistor display device, comprising:

a substrate;

a plurality of thin-film transistor display cells having respective pixel electrodes, on said substrate;

a gate line interconnecting a row of thin-film transistor display cells in said plurality thereof, on said substrate;

a data line interconnecting a column of thin-film transistor display cells in said plurality thereof, said data line comprised of a plurality of data line segments which are coplanar with the gate line; and a plurality of data line jumpers which electrically connect the plurality of data line segments together and comprise an optically transparent conductive material.

2. The thin-film transistor display device of claim 1, wherein said plurality of data line jumpers are comprised of a composite of an optically transparent conductive material and amorphous silicon.

3. The thin-film transistor display device of claim 2, wherein said plurality of thin-film transistor display cells have respective source electrodes; and wherein each of the source electrodes in said plurality of display cells are contiguous with a respective one of said plurality of data line jumpers.

* * * * *